US012765056B2

(12) United States Patent
Qiao et al.

(10) Patent No.: US 12,765,056 B2
(45) Date of Patent: Oct. 13, 2026

(54) SEMICONDUCTOR STRUCTURE WITH SILICON-ON-INSULATOR SUBSTRATE AND THE MANUFACTURING METHOD THEREOF

(71) Applicant: UNITED MICROELECTRONICS CORP., Hsin-Chu City (TW)

(72) Inventors: Yueran Qiao, Singapore (SG); Yi Liu, Singapore (SG); Guohai Zhang, Singapore (SG); Genmao Liu, Singapore (SG); Lei Zhu, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 434 days.

(21) Appl. No.: 18/505,094

(22) Filed: Nov. 8, 2023

(65) Prior Publication Data

US 2025/0126889 A1 Apr. 17, 2025

(30) Foreign Application Priority Data

Oct. 17, 2023 (TW) ................................ 112139591

(51) Int. Cl.

| | |
|---|---|
| ***H01L 27/12*** | (2006.01) |
| ***H10D 30/60*** | (2025.01) |
| ***H10D 30/63*** | (2025.01) |
| ***H10D 86/00*** | (2025.01) |
| ***H10D 86/01*** | (2025.01) |

(52) U.S. Cl.
CPC ......... *H10D 86/201* (2025.01); *H10D 30/601* (2025.01); *H10D 30/637* (2025.01); *H10D 86/01* (2025.01)

(58) Field of Classification Search
CPC .... H10D 86/201; H10D 86/01; H10D 30/637; H10D 30/024; H10D 30/62; H10D 30/014; H10D 62/151; H10D 84/834; H10D 84/853; H10D 84/0193; H10D 30/6219; H10D 84/83; H10D 84/0149; H10D 84/013; H10D 62/116; H10D 30/6211; H10D 62/021; H10D 30/031; H10D 84/0186; H10D 64/0112; H10D 84/0147; H10D 84/0177; H10D 64/62; H10D 30/6713; H10D 64/518; H10D 64/685; H10D 30/0243; H10D 64/01318; H10D 64/258; H10D 84/0181; H10D 64/256; H10D 84/0172; H10D 64/251; H10D 84/0144; H10D 30/6729; H10D 86/215; H10D 86/011; H10D 84/0133; H10D 62/235; H10D 30/611; H10D 30/021; H10D 84/8311; H10D 30/501; H10D 64/671;

(Continued)

(56) References Cited

U.S. PATENT DOCUMENTS

| | | | | |
|---|---|---|---|---|
| 10,290,611 B2 | 5/2019 | Yu | | |
| 2010/0187694 A1* | 7/2010 | Yu | H10W 20/023 | 438/653 |
| 2018/0130886 A1* | 5/2018 | Kim | H10D 30/0212 | |

* cited by examiner

*Primary Examiner* — Niki H Nguyen
(74) *Attorney, Agent, or Firm* — Winston Hsu

(57) ABSTRACT

The invention provides a semiconductor structure comprising a silicon-on-insulator (SOI) substrate, which comprises a silicon layer and an insulating layer stacked from bottom to top, a phosphosilicate glass (PGS) on the insulating layer, and a fluorosilicate glass (FSG) on the phosphosilicate glass. The probability of ions infiltrating into the transistor can be reduced and the yield of products can be improved.

17 Claims, 3 Drawing Sheets

(58) Field of Classification Search
CPC ... H10D 62/292; H10D 30/0245; H10D 62/85
See application file for complete search history.

SEMICONDUCTOR STRUCTURE WITH SILICON-ON-INSULATOR SUBSTRATE AND THE MANUFACTURING METHOD THEREOF

BACKGROUND OF THE INVENTION

1. Field of the Invention

The present invention relates to the field of semiconductors, in particular to a semiconductor structure including a silicon-on-insulator (SOI) substrate and a manufacturing method thereof.

2. Description of the Prior Art

With the progress of semiconductor manufacturing process, the number of components per unit area has gradually increased, and the semiconductor structure has also begun to develop in the direction of three-dimensional stacking. In addition, in order to improve the yield and reduce the difficulty of the process, different components may be fabricated on different chips, and then the two chips are bonded to each other, which can greatly improve the efficiency of the process.

During chip bonding, the bonding quality at the interface between two chips will affect the performance of the whole semiconductor device, and the interface surface of the chips before bonding is prone to defects, so how to reduce these defects to improve the quality of the bonded semiconductor structure is one of the development directions in this field.

SUMMARY OF THE INVENTION

The invention provides a semiconductor structure comprising a silicon-on-insulator (SOI) substrate, which comprises a silicon layer and an insulating layer stacked from bottom to top, a phosphosilicate glass (PGS) on the insulating layer, and a fluorosilicate glass (FSG) on the phosphosilicate glass.

The invention also provides a method for forming a semiconductor structure comprising a silicon-on-insulator (SOI) substrate, which comprises providing a silicon-on-insulator substrate, which comprises a silicon layer and an insulating layer stacked from bottom to top, forming a phosphosilicate glass (PGS) on the insulating layer, and forming a fluorosilicate glass (FSG) on the phosphosilicate glass.

The present invention is characterized in that the applicant found that if only fluorosilicate glass is formed on the back surface of the SOI substrate, when the back surface planarization step is carried out, ions contained in the polishing solution will easily penetrate into the doped region of the transistor, thus affecting the electrical properties of the transistor. Therefore, in addition to forming fluorosilicate glass, a phosphosilicate glass is additionally formed between the SOI substrate and the fluorosilicate glass, the phosphorus ions contained in the phosphosilicate glass is good at grasping 1A or 2A ions (e.g., potassium ions) in the polishing solution, so that the probability of ions infiltrating into the transistor can be reduced and the yield of products can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
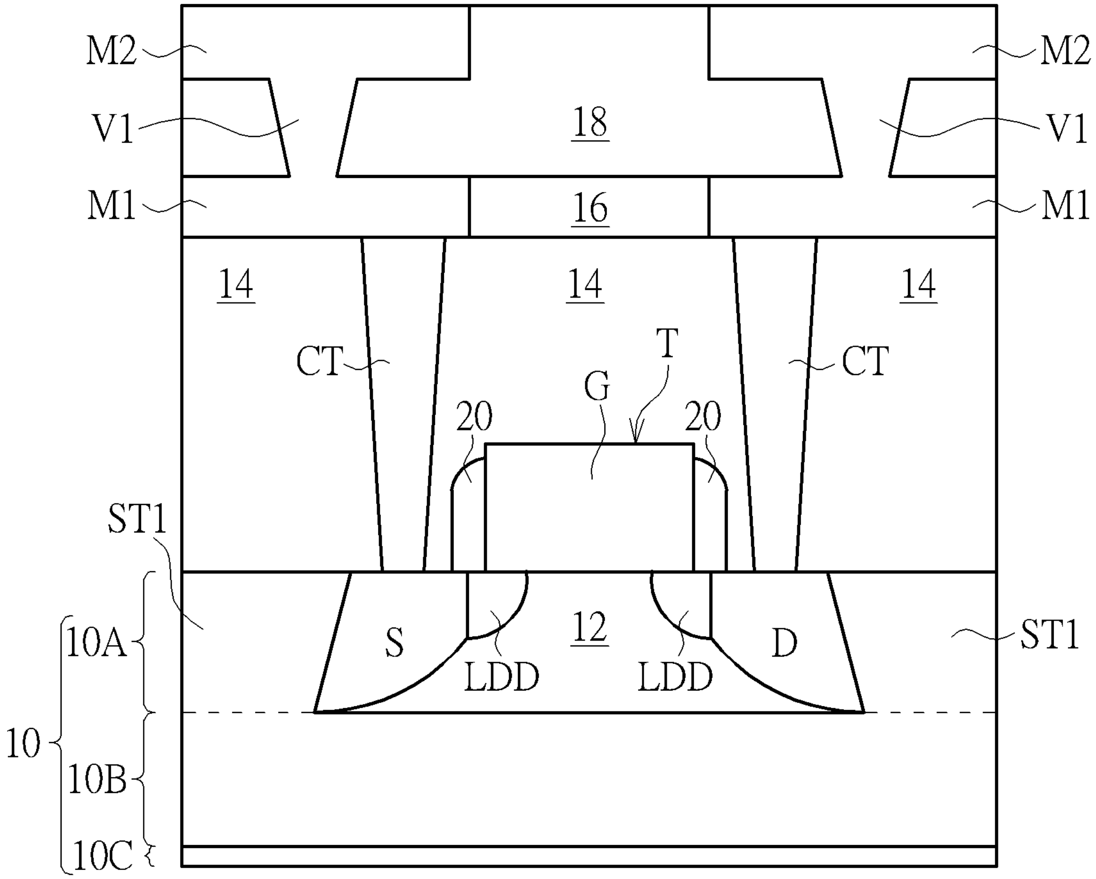
FIGS. 1-2 show a schematic cross-sectional view of a semiconductor structure including a silicon-on-insulator (SOI) substrate according to an embodiment of the present invention.

FIG. 1 shows a schematic cross-sectional view of a semiconductor structure including a silicon-on-insulator (SOI) substrate according to an embodiment of the present invention. As shown in FIG. 1, a substrate 10 is provided. The substrate 10 is a silicon-on-insulator (SOI) substrate, which includes a silicon layer 10A located on an insulating layer, the material of the silicon layer 10A is silicon, and the material of the insulating layer is silicon oxide, silicon nitride or silicon oxynitride, for example. In this embodiment, the insulating layer is a composite layer including a silicon oxide layer 10B on a silicon oxynitride layer 10C, but the present invention is not limited to this. Next, a transistor T is formed on the silicon layer 10A, the transistor T includes a gate G, a source region S and a drain region D. More specifically, a well region 12, the source region S, the drain region D and lightly doped drains LDD are formed in the silicon layer 10A by doping, and shallow trench isolation STI is formed outside the source region S and the drain region D. In addition, in this embodiment, if the transistor is an N-type transistor, the source region S, the drain region D and the lightly doped drain LDD are doped with N-type ions, while the well region 12 is doped with P-type ions. But the present invention is not limited thereto. The material of shallow trench isolation STI is, for example, silicon oxide, which is the same as that of silicon oxide layer 10B (the interface between them is indicated by dotted line in FIG. 1).

On the silicon layer 10A, multi-layer structures can be included, which include multi-layer dielectric layers, and the dielectric layers can also include multiple devices, such as the gate of transistors, contact structures or wire structures. More specifically, the dielectric layer 14, the dielectric layer 16 and the dielectric layer 18 are located on the silicon layer 10A, and the materials of the dielectric layers 14, 16 and 18 are, for example, silicon oxide, silicon nitride, silicon oxynitride, ultra-low dielectric constant material (ULK), low-k material, fluorosilicate glass (FSG), etc. The present invention is not limited to this. Spacers 20 are formed on both sides of the gate G. Both the gate G and the spacer 20 are located in the dielectric layer 14. The material of the gate G may include polysilicon or metal, and the material of the spacer 20 is, for example, silicon oxide, silicon nitride or silicon oxynitride. In addition, the dielectric layer 14 further contains contact structures CT, which electrically connect the source region S and the drain region D. Then, the contact structures CT further connect the metal layer M1, the contact via V1 and the metal layer M2 contained in the upper dielectric layers 16 and 18, and these metal layers and contact vias are used to connect the transistor T to other devices, such as various active or passive devices formed subsequently, or to other chips by means of hybrid bond.

It is worth noting that other dielectric layers or metal layers and other elements can be continuously formed above the metal layer M2. Most of the transistor structures and other elements described in FIG. 1 are known in the art, so the parts not detailed herein can refer to the conventional transistor structures or related elements, and the details are not repeated here.

As shown in FIG. 1, the semiconductor structure shown in FIG. 1 is defined as a front surface and a back surface, the front surface is the surface on which the transistor T and the metal layers M1 and M2 are formed, and the back surface is the bottom of the substrate 10, that is, the surface exposed by the silicon oxynitride layer 10C. As mentioned above, in the following steps, the front surface of the semiconductor structure may be connected to other components or connected to other chips by means of hybrid bond. Subsequently, in order to effectively improve the density of the semiconductor structure, the bonded wafer is turned over, that is, some other elements, such as inductor or various metal circuits, are formed on the back of the semiconductor structure.

Figure 2:
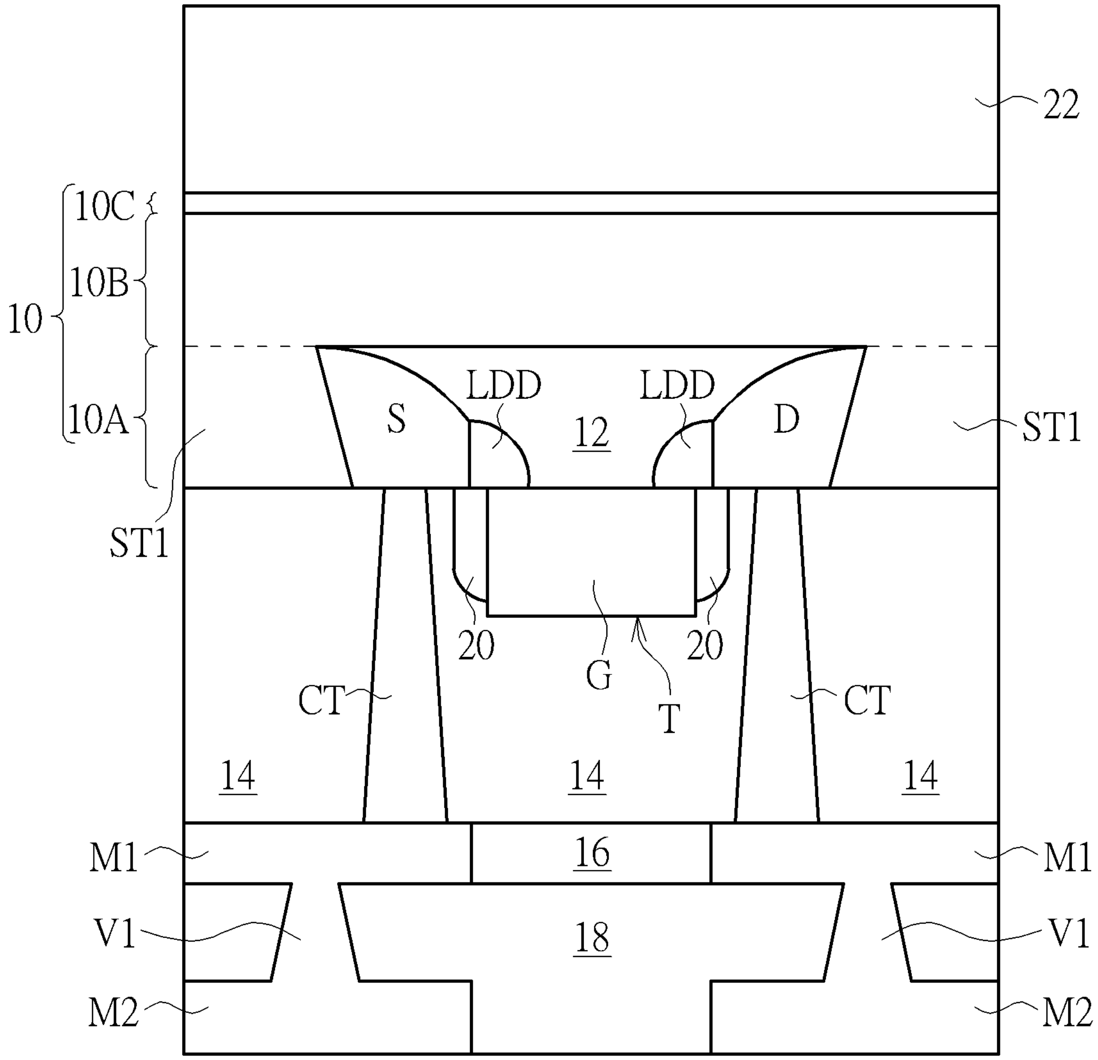

As shown in FIG. 2, the semiconductor structure shown in FIG. 1 is inverted (the back surface of the inverted semiconductor structure is upward and the front surface is downward), and a fluorosilicate glass (FSG) 22 is formed on the silicon oxynitride layer 10C. The fluorosilicate glass 22 can be used as the material of the first dielectric layer on the back surface of the semiconductor, that is to say, other elements such as wires can be formed in the fluorosilicate glass 22, which are not shown here for the sake of simplicity. In this embodiment, the fluorosilicate glass 22 is located on the back surface of the SOI substrate 10 of a semiconductor structure, that is, the fluorosilicate glass 22 is in direct contact with the silicon oxynitride layer 10C of the SOI substrate 10. In this embodiment, the thickness of the fluorosilicate glass 22 is about 3500 angstroms, but it is not limited to this.

It is worth noting that in other embodiments, the SOI substrate may also include a three-layer stacked structure of a silicon layer, an insulating layer and a silicon layer, and after the components on the front surface of the SOI substrate are formed, the SOI substrate is turned over to the back surface, and then the topmost silicon layer after turned (i.e., the original bottom silicon layer) is removed by a planarization step, so that the middle insulating layer (i.e., the silicon oxide layer 10B) is exposed before forming the silicon oxynitride layer 10C. That is to say, the silicon oxynitride layer 10C is formed on the silicon oxide layer 10B after the back surface process, rather than at the beginning. This implementation step is also within the scope of the present invention.

Next, the back surface component processes are carried out, such as forming components or wires and carrying out planarization steps. However, the applicant found that the planarization step is, for example, chemical mechanical polishing (CMP), in which the polishing solution contains ions that easily penetrate through the fluorosilicate glass 22. For example, the polishing solution used in this example contains potassium ions (K+), which is used as a dispersant in the polishing solution to avoid particle agglomeration, and potassium ions easily penetrate through the fluorosilicate glass 22. It can Be understood that other kinds of polishing solutions can be used in the present invention, and other polishing solutions may contain, for example, 1A group ions: lithium (Li), sodium (Na), potassium (K), rubidium (Rb), cesium (Cs), thulium (Fr) or 2A group ions: beryllium (Be), magnesium (Mg), calcium (Ca), strontium (Sr), barium (Ba), radium (Ra), etc. If the first dielectric layer on the back surface of the SOI substrate 10 is the fluorosilicate glass 22, the group 1A ions or the group 2A ions will easily penetrate through the fluorosilicate glass 22 during the chemical mechanical polishing of the back surface, and then penetrate into the channel region of the transistor T and affect the electrical properties of the transistor. Especially when a back gate is not formed on the back surface of the semiconductor structure, the ions infiltrated because there is no back gate barrier will affect the electrical properties of the transistor.

Figure 3:
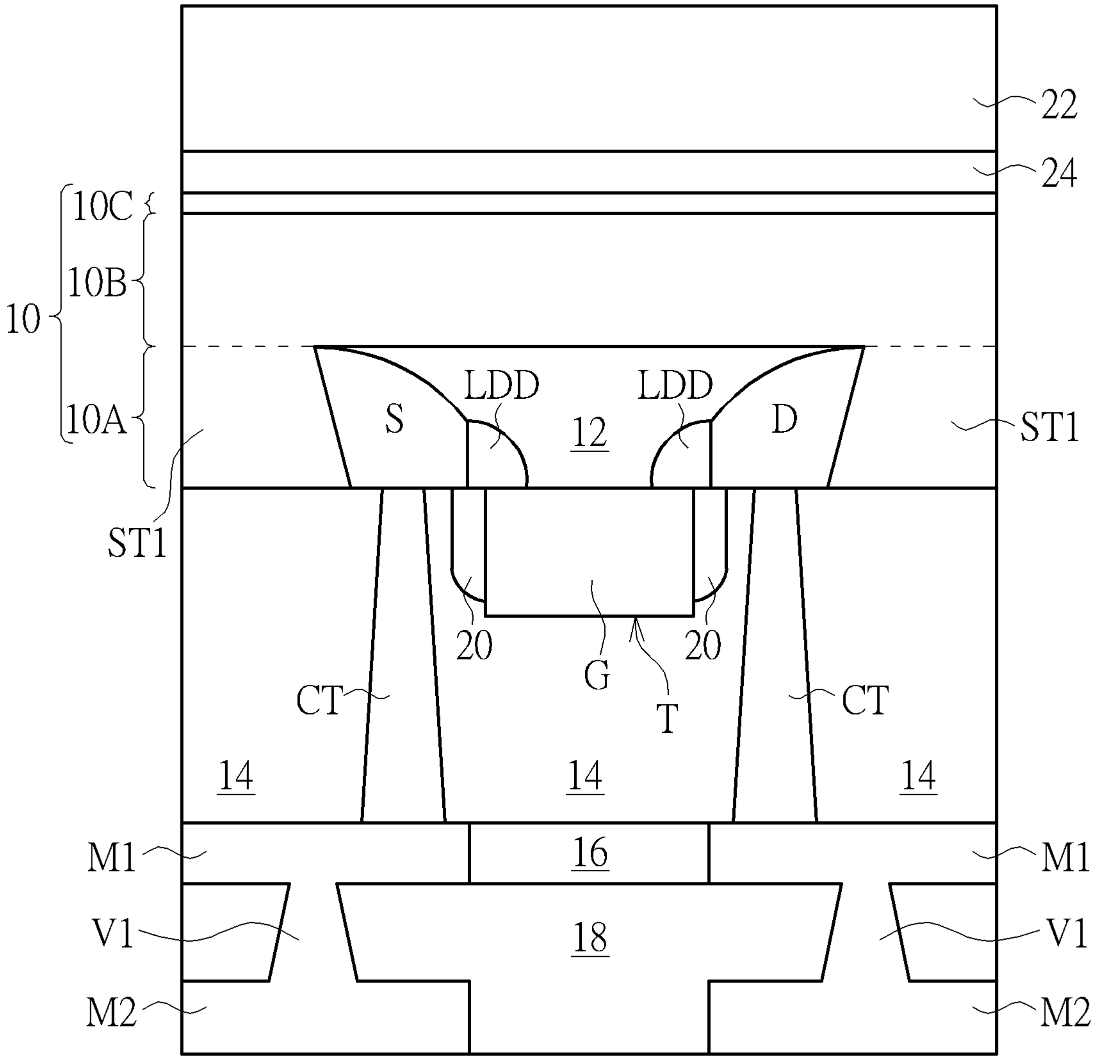
FIG. 3 is a schematic cross-sectional view of a semiconductor structure including a silicon-on-insulator (SOI) substrate according to another embodiment of the invention.

Therefore, in order to solve the problem that the above ions penetrate through the fluorosilicate glass and affect the electrical properties, please refer to FIG. 3, which shows a schematic cross-sectional view of a semiconductor structure including a silicon-on-insulator (SOI) substrate according to another embodiment of the present invention. Most of the elements in FIG. 3 are the same as those in FIG. 2, so the details are not repeated here. However, unlike the structure in FIG. 2, a phosphosilicate glass (PGS)24 is further included between the silicon oxynitride layer 10C and the fluorosilicate glass 22, the thickness of the phosphosilicate glass 24 in this embodiment is about 1000 angstroms, and the thickness of the fluorosilicate glass 22 is about 2500 angstroms. Therefore, the total thickness of the phosphosilicate glass 24 and the fluorosilicate glass 22 is about 3,500 angstroms, which is approximately equivalent to the thickness of the fluorosilicate glass 22 in the above-mentioned FIG. 2.

In this embodiment, the function of phosphosilicate glass 24 is to collect and block potassium ions. More specifically, phosphosilicate glass 24 contains phosphorus trioxide ($P_2O_3$), which is easy to combine with potassium ions to form $K_2P_2O_3$, so as to prevent potassium ions from penetrating through fluorosilicate glass 22. Therefore, in this embodiment, a phosphosilicate glass 24 is further formed between the fluorosilicate glass 22 and the silicon oxynitride layer 10C, which can reduce the probability that potassium ions in the semiconductor structure will penetrate into the channel region of the transistor during the chemical mechanical polishing, and further improve the quality of the whole device.

Based on the above description and drawings, the present invention provides a semiconductor structure including a silicon-on-insulator (SOI) substrate, which includes a silicon layer 10A and an insulating layer (a silicon oxide layer 10B and a silicon oxynitride layer 10C) stacked from bottom to top, a phosphosilicate glass (PGS)24 located on the insulating layer, and a fluorosilicate glass (FSG)22 located on phosphosilicate glass 24 (see FIG. 3).

The invention further provides a method for forming a semiconductor structure comprising a silicon-on-insulator (SOI) substrate, which comprises providing a silicon-on-insulator substrate 10, wherein the silicon-on-insulator substrate 10 comprises a silicon layer 10A and an insulating layer (a silicon oxide layer 10B and a silicon oxynitride layer 10C) stacked from bottom to top, a phosphosilicate glass (PGS)24 is formed and located on the insulating layer, and a fluorosilicate glass (FSG)22 is formed and located on the phosphosilicate glass 24 (see FIG. 3).

In some embodiments of the present invention, a thickness of the phosphosilicate glass 24 is less than a thickness of the fluorosilicate glass 22 (for example, 1000 angstroms and 2500 angstroms, respectively).

In some embodiments of the present invention, the insulating layer includes a silicon oxide layer 10B and a silicon oxynitride layer 10C stacked from bottom to top (as shown in FIG. 3).

In some embodiments of the present invention, the phosphosilicate glass 24 directly contacts the silicon oxynitride layer 10C.

In some embodiments of the present invention, a transistor T is further included, which is located under the silicon layer 10A.

In some embodiments of the present invention, the transistor T includes a source region S and a drain region D located in the silicon layer 10A, and a gate G located under the silicon layer 10A.

In some embodiments of the present invention, a dielectric layer 14 is further included under the silicon layer 10A.

In some embodiments of the present invention, a plurality of contact structures CT are further included, which are located in the dielectric layer 14 and electrically connected to the source region S and the drain region D.

In some embodiments of the present invention, after the fluorosilicate glass 22 is formed, a planarization step (such as a chemical mechanical polishing step) is further performed.

In some embodiments of the present invention, during the planarization step, a plurality of ions (e.g., potassium ions) are diffused into the fluorosilicate glass 22 from a polishing solution in the planarization step, and the ions are blocked by the phosphosilicate glass 24.

In some embodiments of the present invention, the species of the plurality of ions include group 1A or group 2A ions.

The present invention is characterized in that the applicant found that if only fluorosilicate glass is formed on the back surface of the SOI substrate, when the back surface planarization step is carried out, ions contained in the polishing solution will easily penetrate into the doped region of the transistor, thus affecting the electrical properties of the transistor. Therefore, in addition to forming fluorosilicate glass, a phosphosilicate glass is additionally formed between the SOI substrate and the fluorosilicate glass, the phosphorus ions contained in the phosphosilicate glass is good at grasping 1A or 2A ions (e.g., potassium ions) in the polishing solution, so that the probability of ions infiltrating into the transistor can be reduced and the yield of products can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising a silicon-on-insulator (SOI) substrate, comprising:
   - a silicon-on-insulator substrate, which comprises a silicon layer and an insulating layer stacked from bottom to top, wherein the insulating layer comprises a silicon oxide layer and a silicon oxynitride layer stacked from bottom to top;
   - a phosphosilicate glass (PGS) located on the insulating layer; and
   - a fluorosilicate glass (FSG) located on the phosphosilicate glass.

2. The semiconductor structure comprising a silicon-on-insulator substrate according to claim 1, wherein a thickness of the phosphosilicate glass is smaller than a thickness of the fluorosilicate glass.

3. The semiconductor structure comprising a silicon-on-insulator substrate according to claim 1, wherein the phosphosilicate glass directly contacts the silicon oxynitride layer.

4. The semiconductor structure comprising a silicon-on-insulator substrate according to claim 1, further comprising a transistor located under the silicon layer.

5. The semiconductor structure comprising a silicon-on-insulator substrate according to claim 4, wherein the transistor comprises a source region and a drain region located in the silicon layer, and a gate located under the silicon layer.

6. The semiconductor structure comprising a silicon-on-insulator substrate according to claim 5, further comprising a dielectric layer located under the silicon layer.

7. The semiconductor structure comprising a silicon-on-insulator substrate according to claim 6, further comprising a plurality of contact structures located in the dielectric layer and electrically connecting the source region and the drain region.

8. A method for forming a semiconductor structure including a silicon-on-insulator (SOI) substrate, comprising:
   - providing a silicon-on-insulator substrate, wherein the silicon-on-insulator substrate comprises a silicon layer and an insulating layer stacked from bottom to top, wherein the insulating layer comprises a silicon oxide layer and a silicon oxynitride layer stacked from bottom to top;
   - forming a phosphosilicate glass (PGS) on the insulating layer; and
   - forming a fluorosilicate glass (FSG) on the phosphosilicate glass.

9. The method for forming a semiconductor structure including a silicon-on-insulator substrate according to claim 8, wherein a thickness of the phosphosilicate glass is smaller than a thickness of the fluorosilicate glass.

10. The method for forming a semiconductor structure including a silicon-on-insulator substrate according to claim 9, wherein the phosphosilicate glass directly contacts the silicon oxynitride layer.

11. The method for forming a semiconductor structure including a silicon-on-insulator substrate according to claim 9, further comprising forming a transistor under the silicon layer.

12. The method for forming a semiconductor structure including a silicon-on-insulator substrate according to claim 11, wherein the transistor comprises a source region and a drain region located in the silicon layer, and a gate electrode located below the silicon layer.

13. The method for forming a semiconductor structure including a silicon-on-insulator substrate according to claim 12, further comprising forming a dielectric layer under the silicon layer.

14. The method for forming a semiconductor structure including a silicon-on-insulator substrate according to claim 13, further comprising forming a plurality of contact structures located in the dielectric layer and electrically connecting the source region and the drain region.

15. The method for forming a semiconductor structure including a silicon-on-insulator substrate according to claim 9, wherein after the fluorosilicate glass is formed, the method further comprises performing a planarization step to the fluorosilicate glass.

16. The method for forming a semiconductor structure including a silicon-on-insulator substrate according to claim 15, wherein during the planarization step, a plurality of ions are diffused into the fluorosilicate glass from a polishing solution in the planarization step and blocked by the phosphosilicate glass.

17. The method for forming a semiconductor structure including a silicon-on-insulator substrate according to claim 16, wherein the species of the plurality of ions comprise group 1A or group 2A ions.

* * * * *